(12) United States Patent
Sakuma et al.

(10) Patent No.: US 6,891,131 B2
(45) Date of Patent: May 10, 2005

(54) THERMAL PROCESSING SYSTEM

(75) Inventors: Takeshi Sakuma, Kanagawa (JP); Takashi Shigeoka, Nirasaki (JP); Yicheng Li, Kanagawa (JP)

(73) Assignee: Tokyo Electron Limited, Tokyo (JP)

( * ) Notice: Subject to any disclaimer, the term of this patent is extended or adjusted under 35 U.S.C. 154(b) by 71 days.

(21) Appl. No.: 10/257,622

(22) PCT Filed: Apr. 17, 2001

(86) PCT No.: PCT/JP01/03278

§ 371 (c)(1),
(2), (4) Date: Jun. 18, 2003

(87) PCT Pub. No.: WO01/82348

PCT Pub. Date: Nov. 1, 2001

(65) Prior Publication Data

US 2004/0013419 A1 Jan. 22, 2004

(30) Foreign Application Priority Data

Apr. 20, 2000 (JP) ........................ 2000-119997
Apr. 20, 2000 (JP) ........................ 2000-119998

(51) Int. Cl.[7] .................................. F27B 5/14
(52) U.S. Cl. .................. 219/390; 219/405; 219/411; 392/416; 392/418; 118/724; 118/725; 118/501
(58) Field of Search ..................... 219/390, 405, 219/411; 118/724, 725, 50.1; 392/416, 418

(56) References Cited

U.S. PATENT DOCUMENTS

| | | | |
|---|---|---|---|
| 5,332,442 A | | 7/1994 | Kubodera et al. |
| 6,002,109 A | * | 12/1999 | Johnsgard et al. ........... 219/390 |
| 6,156,079 A | * | 12/2000 | Ho et al. ................... 29/25.01 |

FOREIGN PATENT DOCUMENTS

| | | | |
|---|---|---|---|
| JP | 60-727 | | 1/1985 |
| JP | 61-86935 | | 6/1986 |
| JP | 61-198735 | | 9/1986 |
| JP | 64-11324 | | 1/1989 |
| JP | 64-011324 | * | 1/1989 |
| JP | 1-296615 | | 11/1989 |
| JP | 3-210784 | | 9/1991 |
| JP | 7-58189 | | 3/1995 |
| JP | 11-8204 | | 1/1999 |
| JP | 2000-91257 | | 3/2000 |

\* cited by examiner

*Primary Examiner*—Shawntina Fuqua
(74) *Attorney, Agent, or Firm*—Crowell & Moring LLP

(57) ABSTRACT

A thermal processing system performs predetermined thermal processing on an approximately circular to-be-processed object, by applying radiant heat to the to-be-processed object by means of a heating lamp system. The heating lamp system comprises a plurality of lamps disposed concentrically so as to correspond to the to-be-processed object. The plurality of lamps are controlled individually for respective zones of the to-be-processed object.

11 Claims, 15 Drawing Sheets

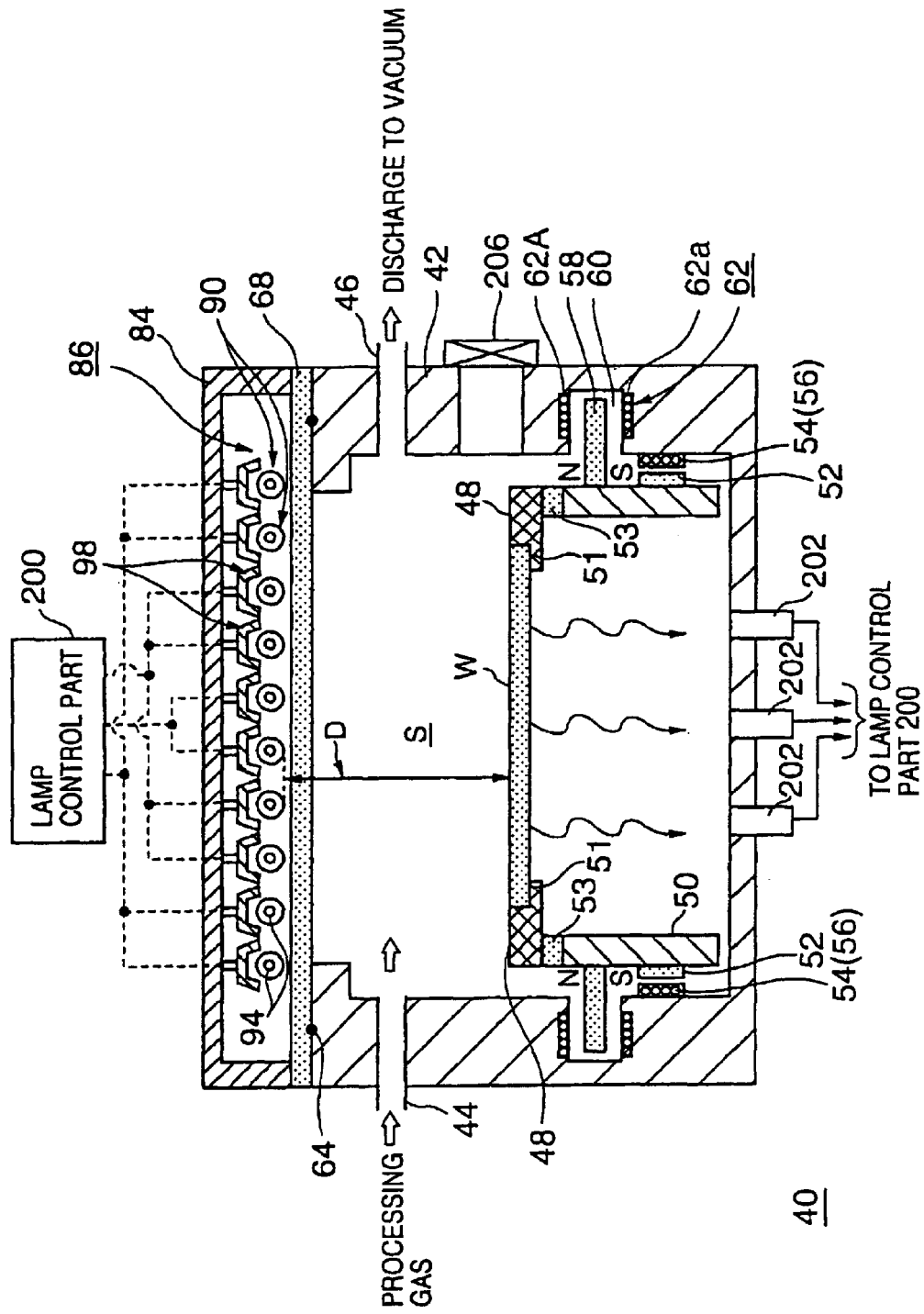

THERMAL PROCESSING SYSTEM

TECHNICAL FIELD

The present invention relates to a system for performing thermal processing, such as annealing processing, CVD (Chemical Vapor Deposition) or the like, on a to-be-processed object, such as a semiconductor wafer, for example, by using a heating lamp system.

BACKGROUND ART

In general, in order to manufacture a semiconductor integrated circuit, various thermal processes such as a deposition process, an annealing process, an oxidization and diffusion process, a spattering process, an etching process, a nitriding process and so forth are performed several times repeatedly on a silicon substrate such as a semiconductor wafer.

In this case, in order to maintain electric characteristics of the integrated circuit and throughput of the products to high level, the above-mentioned various thermal processes should be performed on the entire surface of the wafer more uniformly. For this purpose, because the progress of the thermal process remarkably depends on the temperature of the wafer, the temperature of the wafer should be uniform throughout the entire surface thereof at high accuracy in the thermal processing.

In order to maintain the temperature of the wafer uniform throughout the entire surface thereof, various methods are known. For example, in one method used in a single-wafer-type thermal processing system, a placement table on which a semiconductor wafer is placed is rotated so that occurrence of unevenness in temperature is avoided.

FIGS. 1 and 2 show two examples of thermal processing systems in the related art.

In FIG. 1, in a processing chamber 2 in which a vacuum can be produced, a thin placement table 4 is set which is supported on a bottom of the chamber 2, on which table a semiconductor wafer W is placed. A shower head part 6 for providing a necessary processing gas such as a deposition gas into the processing chamber 2 is set on a top of the processing chamber 2. Further, on a bottom of the processing chamber 2, a transmitting window 8 made of a quarz glass, for example, is mounted in an airtight manner, and, beneath it, a plurality of heating lamps 10 such as halogen lamps, for example, are mounted on a rotational table 12 which also serves as a reflective plate. The wafer W is heated from the rear side thereof by means of radiant heat from the heating lamps 10 while the rotational table 12 is rotated. Thereby, it is attempted to heat the surface of the wafer W uniformly.

In a thermal processing system shown in FIG. 2, a gas providing nozzle 14 for providing a processing gas is provided in a side wall of the processing chamber 2 on one side, while a discharge mouth 16 for producing a vacuum is provided on the other side. Transmitting windows 18 and 20 made of a quarz glass are provided on a top and a bottom of the processing chamber 2. Further, above the upper transmitting window 18 and beneath the lower transmitting window 20, heating lamps 22 are disposed, and, thereby, the wafer W is heated from both top and bottom sides thereof. The placement table 4 is supported on a rotational shaft 24 passing through a bottom plate of the processing chamber 2 in an airtight manner, and, as a result, is rotatable. In this system, while the wafer W is rotated, the wafer W is heated from both sides, and, thus, it is attempted to heat the surfaces of the wafer W uniformly.

In the system shown in FIG. 1, the heating lamps 10 are rotated. However, this system has a configuration such that a gate valve 26 is provided in the side wall of the processing chamber 2 for bringing in the wafer W. Accordingly, there is not a necessarily sufficient isotropy in view of temperature. As a result, it may not be possible to achieve a sufficiently uniform temperature distribution throughout the surface of the wafer W.

In the system shown in FIG. 2, as the wafer W itself is rotated, isotropy in temperature of the side wall of the processing chamber 2 may be not so problematic. However, as the upper transmitting window 18 has a very high temperature due to radiant heat from the heating lamps 22 and from the wafer W, especially in a case of a deposition process, a deposition film or a reaction by-product may adhere to this transmitting window 18, by which the luminous intensity transmitted by the transmitting window 18 may be changed, and, as a result, repeatability may be degraded, or particles may be generated therefrom. Further, although $N_2$ purge such as providing an inert nitrogen gas little by little toward the rear surface of the placement table 4 is performed, there is also a possibility, even fewer, that such a problem as the adherence of a deposition film or a reaction by-product occurs for the lower transmitting window 20.

Further, this problem of adherence of a deposition film or a reaction by-product may also occur for the inner wall of the processing chamber 2 as it has a high temperature. Accordingly, it is necessary to perform cleaning of the processing chamber 2 frequently.

Furthermore, each of the above-mentioned transmitting windows 8, 18 and 20 has a large thickness for the purpose of increasing a pressure resistively thereof. As a result, the heat capacity thereof is large, and, thereby, controllability of the temperature of the wafer W therethrough is degraded. Further, the distance between the heating lamps and wafer W increases as the thickness of the transmitting window increases. As a result, the directivity of the heating lamps is degraded.

In order to improve the directivity of the heating lamps, it is effective to shorten the distance D between the surface of the wafer W and the heating lamps (22, for example in FIG. 2) so that diffusion of the radiant heat of the heating lamps is reduced.

For example, FIGS. 3A and 3B are graphs showing relationships between the directivity of the heating lamps and the above-mentioned distance D. FIG. 3A shows the directivity for D of 55 mm, while FIG. 3B shows the directivity for D of 35 mm. Each curve in the figures represents a temperature dependency on the wafer for a respective heating lamp. As can be seen from the figures, in the case of FIG. 3A, the peak of each curve is gentle. Accordingly, the number of heating lamps contributing to heat a specific zone of the wafer is large, and, thus, the directivity is low. In contrast thereto, in the case of FIG. 3B, as the peak of each curve is sharp, the number of heating lamps contributing to heat a specific zone of the wafer is small, and thus, the directivity is high.

Thus, in order to improve the directivity of the heating lamps, it is preferable to shorten the distance D. However, in a case where thermal processing of the wafer is performed in a vacuum atmosphere (pressure-reduced atmosphere), a thickness t of the transmitting window 20 made of a quarz glass should be on the order of 30 through 40 mm for a diameter thereof on the order of 400 mm, for example, so as to secure a high pressure resistivity of the transmitting window 20. Thereby, the directivity of the heating lamps are degraded, and, also, the temperature controllability is degraded as a result of the heat capacity of the transmitting window 20 being increased due to the increased thickness t thereof.

In order to solve this problem, the pressure resistivity of the transmitting window 20 may be increased as a result of shaping it to a dome shape having an approximately hemisphere shape, for example, as shown in FIG. 4. However, in this case, although it is possible to reduce the thickness of the transmitting window 20 itself to the order of 10 through 20 mm, the total height H of the dome-shaped transmitting window 20 is on the order of 60 through 70 mm. Accordingly, this method cannot solve the problem in that the above-mentioned distance D should be shortened.

FIGS. 5 and 6 show another example of a thermal processing system in the related art. FIG. 5 shows a general configuration of the thermal processing system, and FIG. 6 shows a plan view illustrating an arrangement of heating lamps of the thermal processing system. As shown in FIG. 5, in a processing chamber 102, a ring-shaped placement table 104 is provided. The periphery of the semiconductor wafer W on the bottom side thereof is made contact with the inner circumference of the placement table 104 on the top side thereof, and, thus, the wafer W is supported by the placement table 104. This placement table 104 is fixed on a top end of a cylindrical leg part 106 which is supported by a bottom of the processing chamber 109 via a ring-shaped bearing part 103. Thus, the placement table 104 is rotatable along a circumferential direction of the cylindrical leg part 106.

A rack 110 is provided on the inner wall of the leg part 106 along the circumferential direction of the leg part 106. Further, a driving shaft 114 of a driving motor 112 provided beneath the chamber 102 projects upward through the bottom of the chamber 102 in an airtight manner. The driving shaft 114 has a pinion 116 fixed on the top thereof which is engaged with the above-mentioned rack 110. Thereby, the leg part 106 and the placement table 104 integral therewith are rotated. Further, a flat transmitting window 118 made of a quarz glass, for example, is provided on the top of the processing chamber 104 in an airtight manner. Further, above the transmitting window 118, a plurality of heating lamps 120 are provided. Then, by means of radiant heat from the lamps 120, the wafer W is heated to a predetermined temperature. As a result of the placement table 4 being rotated at a time of the heating, the wafer W placed on the placement table 104 is heated while it is rotated. Accordingly, the temperature of the wafer W is made uniform throughout the surface thereof.

In this system, the heating lamps 120 include, as shown in FIG. 6, for example, approximately spherical lamp bodies 122, and reflective plates 124 provided at the rear side of the lamp bodies 122 and formed to be depressed. Thereby, the radiant heat can be efficiently used. Further, in order to enable supply of large power, the lamp bodies 122 include therein filaments 126 extending toward the wafer W spirally. Such a type of lamp bodies are called 'single-end type lamp bodies'. In this case, the plurality of heating lamps 120 are arranged so as to cover the top surface of the above-mentioned semiconductor wafer W.

FIGS. 7 and 8 show another thermal processing system in the related art. In this system, instead of the sphere-liked lamp bodies 122 described above, rod-like lamp bodies 128 are employed in heating lamps 130. At the rear side of the lamp bodies 128, reflective plates 132 each having a sectional shape of approximately hemisphere are disposed. In each lamp body 128, a spirally wound filament 134, for example, is contained so as to extend along a longitudinal direction of the lamp body 128, and electric terminals 136 are provided on both ends of the lamp body 128. Such a type of lamp body 128 is called a 'double-end type lamp body'. The heating lamps 130 are disposed in parallel with predetermined intervals.

When the sphere-shaped lamps 120 with the depressed reflective plates 124 are used as shown in FIGS. 5 and 6, directivity and controllability of the radiant heat are satisfactory. However, in this structure of each lamp 120, the amount of radiant heat in horizontal directions is large, and it is reflected so as to be directed toward the wafer, and energy is lost each time of the reflection. Accordingly, a large amount of energy is lost.

In contrast thereto, when the rod-shaped lamps 130 shown in FIGS. 7 and 8 are used, a large amount of radiant heat is directly irradiated to the wafer. Accordingly, the energy loss is relatively small. However, in this case, each lamp body 128 should cover a relatively large area of the surface of the wafer. Further, because the lamp body 128 is disposed across the wafer, the directivity thereof is degraded. Accordingly, it is difficult to make the temperature of the wafer uniform at high accuracy.

Further, in order to improve the directivity of the radiant heat, a distance D between the surface of the wafer W and the heating lamps 120, for example (see FIG. 5), should be shortened so that diffusion of the radiant heat is made smaller, as described above with reference FIGS. 3A and 3B. Also in this case, it can be considered to employ a dome-shaped transmitting window as the transmitting window 118 in order to reduce the thickness of the transmitting window, as described above with reference FIG. 4. However, as mentioned above, by such a method, the problem cannot be solved substantially.

DISCLOSURE OF THE INVENTION

The present invention has been devised in consideration of the above-described problems, and, an object of the present invention is to provide a system and method of thermal processing employing heating lamps having high directivity and high temperature controllability.

A thermal processing system, according to the present invention, performs predetermined thermal processing on an approximately circular to-be-processed object, by applying radiant heat to the to-be-processed object by means of a heating lamp system, wherein:

the heating lamp system comprises a plurality of lamps disposed concentrically so as to correspond to the to-be-processed object; and the plurality of lamps are controlled individually for respective zones of the to-be-processed object.

Thereby, it is possible to heat the to-be-processed object for the respective concentric zones, individually, for example. Accordingly, it is possible to improve the directivity of the radiant heat of the lamps and controllability of the temperature of the to-be-processed object such as a wafer W. Further, by controlling the temperature of the wafer W for the respective concentrically divided zones of the wafer W, individually, it is possible to control the temperature of the wafer W for respective zones one by one, and, thereby, to make the temperature of the wafer W uniform throughout the enter surface of the wafer W at a higher accuracy.

Specifically, for example, because the periphery of the wafer W may be easily cooled naturally, a larger power is supplied to each lamp located farther from the center of the wafer W. Thereby, it is possible to heat the wafer W uniformly. Thus, as the lamps are disposed concentrically corresponding to the circular wafer W, it is easy to make a control such as to make the temperature of the wafer W uniform throughout the surface of the wafer W by controlling the powers supplied to the respective lamps for the respective concentrically disposed zones. That is, according to the present invention, the configuration of the heating lamps is made to correspond to the concentric temperature variation characteristics/distribution of the circular wafer W.

The thermal processing system may further comprise:

a transmitting window between the heating lamp system and the to-be-processed object; and a reinforcing member reinforcing the transmitting window.

By providing the reinforcing member, it is possible to reduce the thickness of the transmitting window effectively even in a case where a processing chamber is provided for sealing up the wafer W in an airtight manner and thermal processing is performed under a reduced pressure or vacuum atmosphere therein. Accordingly, it is possible to reduce the distance between the heating lamp system and the wafer W. Thereby, it is possible to further improve the directivity of the radiant heat. Further, as it is possible to reduce the heat capacity of the transmitting window due to reduction in thickness thereof, it is possible to further improve the controllability of the temperature of the wafer W for the respective zones.

Furthermore, by forming, in the reinforcing member, concentric slits corresponding to the concentrically disposed plurality lamps, it is possible to efficiently utilize the radiant heat of the lamps for heating the wafer W. Furthermore, it is possible to control the heating of the wafer W more accurately, as nothing exists between the lamps and the wafer W other than the transparent or translucent transmitting window as a result of providing the slits in the reinforcing member.

Other objects and further features of the present invention will become more apparent from the following detailed description when read in conjunction with the accompanying drawings.

BRIEF DESCRIPTION OF THE DRAWINGS

FIG. 18 shows a side-elevational sectional view of a thermal processing system in another variant embodiment of the first embodiment of the present invention shown in FIG. 9 in which thermal processing is performed under atmospheric pressure.

BEST MODE FOR CARRYING OUT THE INVENTION

A thermal processing system in one embodiment of the present invention will now be described.

Figure 9:
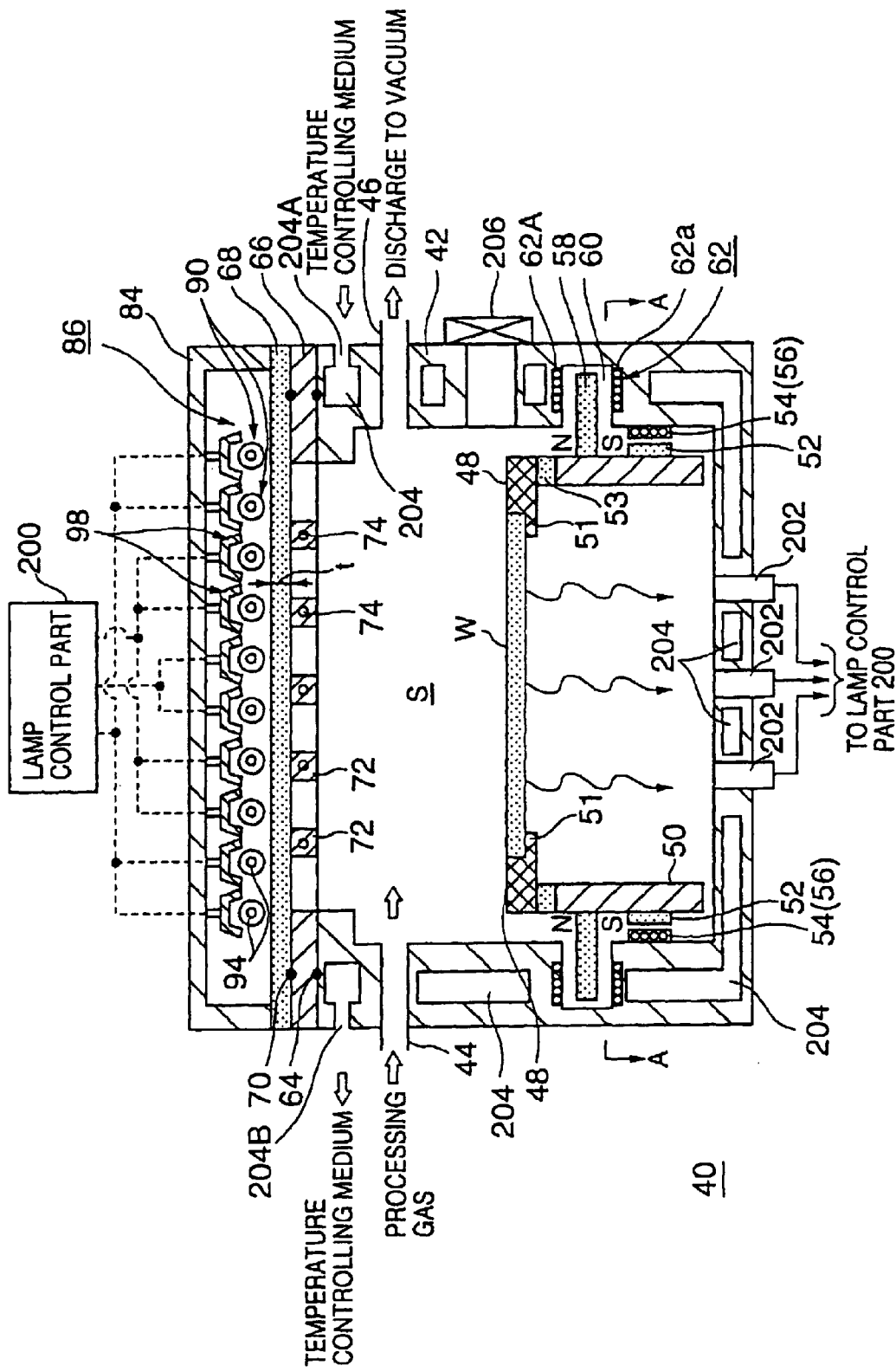
FIG. 9 shows a side-elevational sectional view of a thermal processing system in one embodiment of the present invention.
Figure 10:
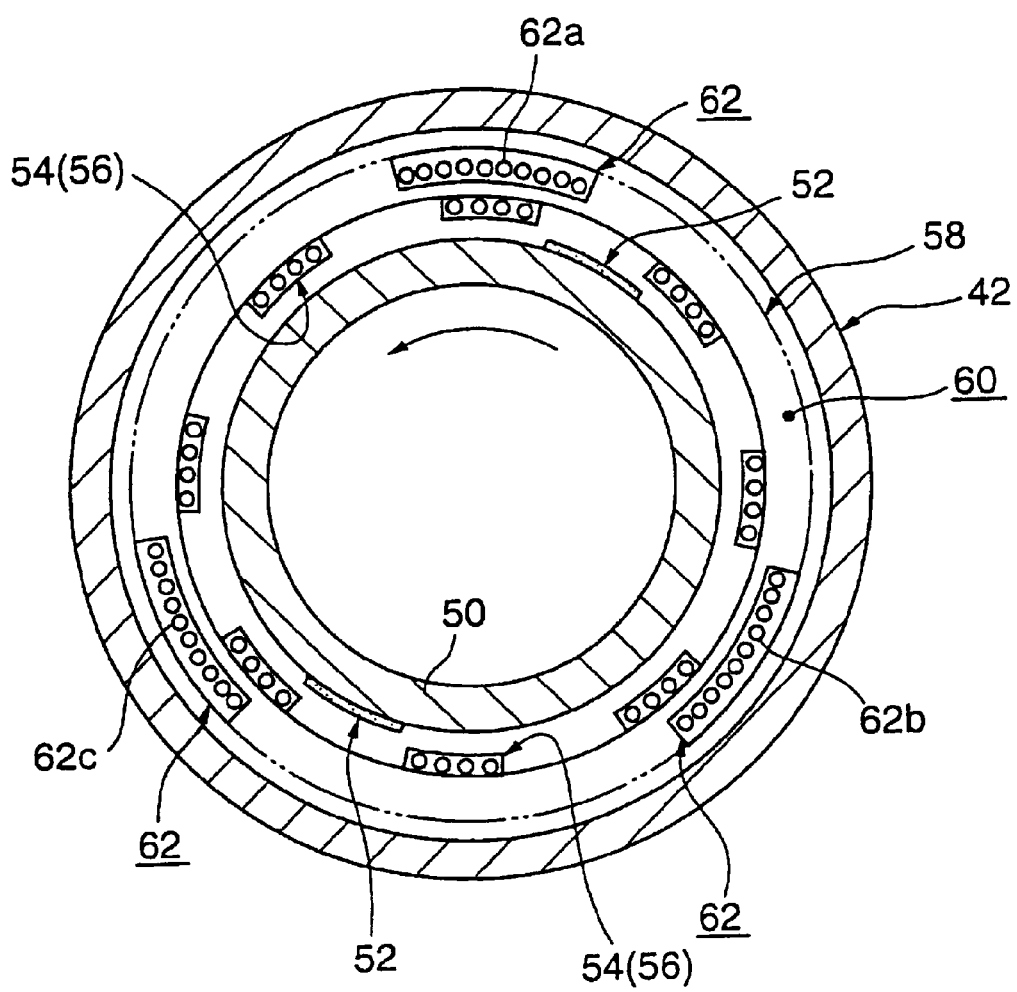
FIG. 10 shows a cross-sectional view of the thermal processing system shown in FIG. 9 taken along a line A—A.
Figure 11:
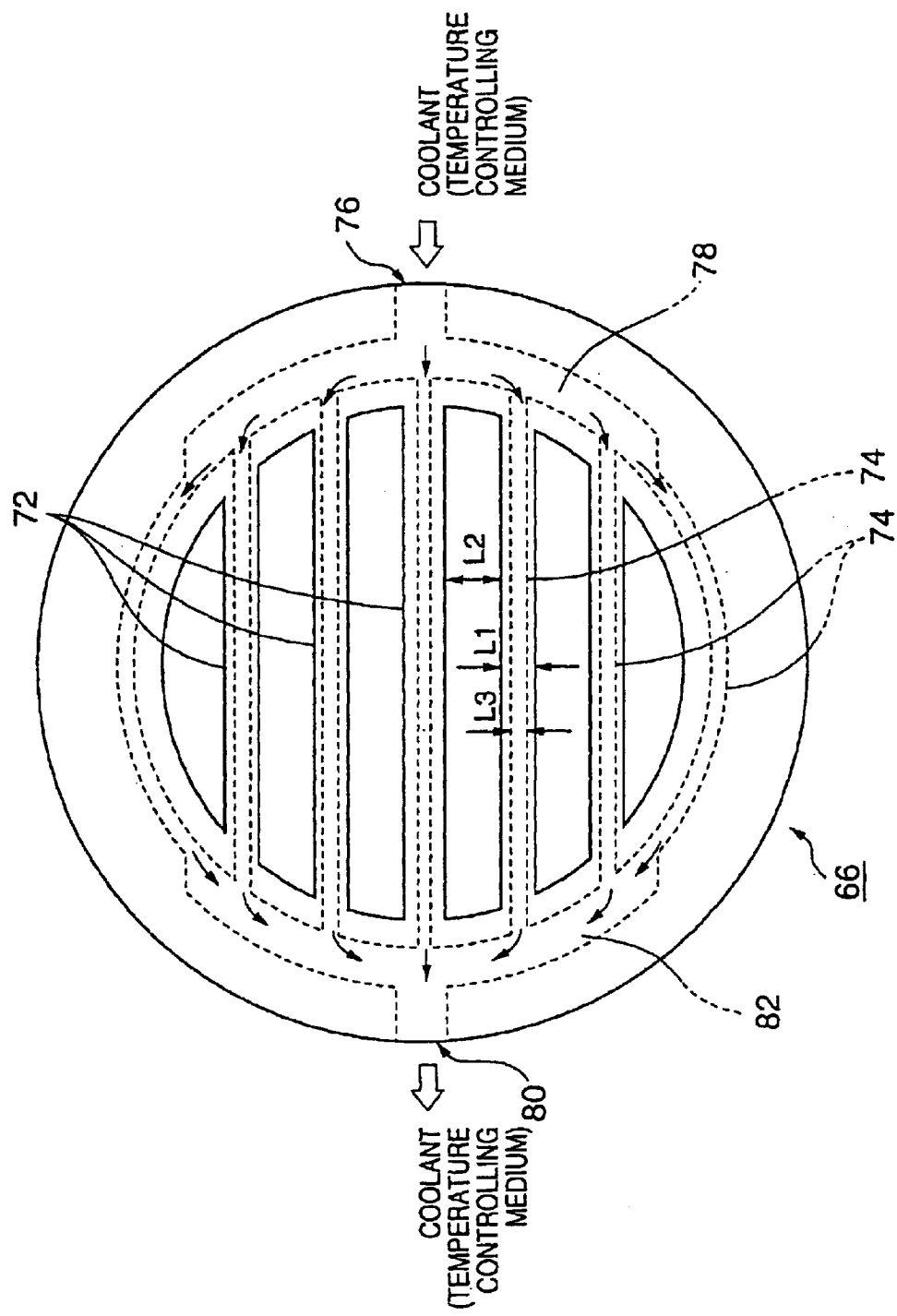
FIG. 11 shows a plan view of a supporting frame member of the thermal processing system shown in FIG. 9.
Figure 12:
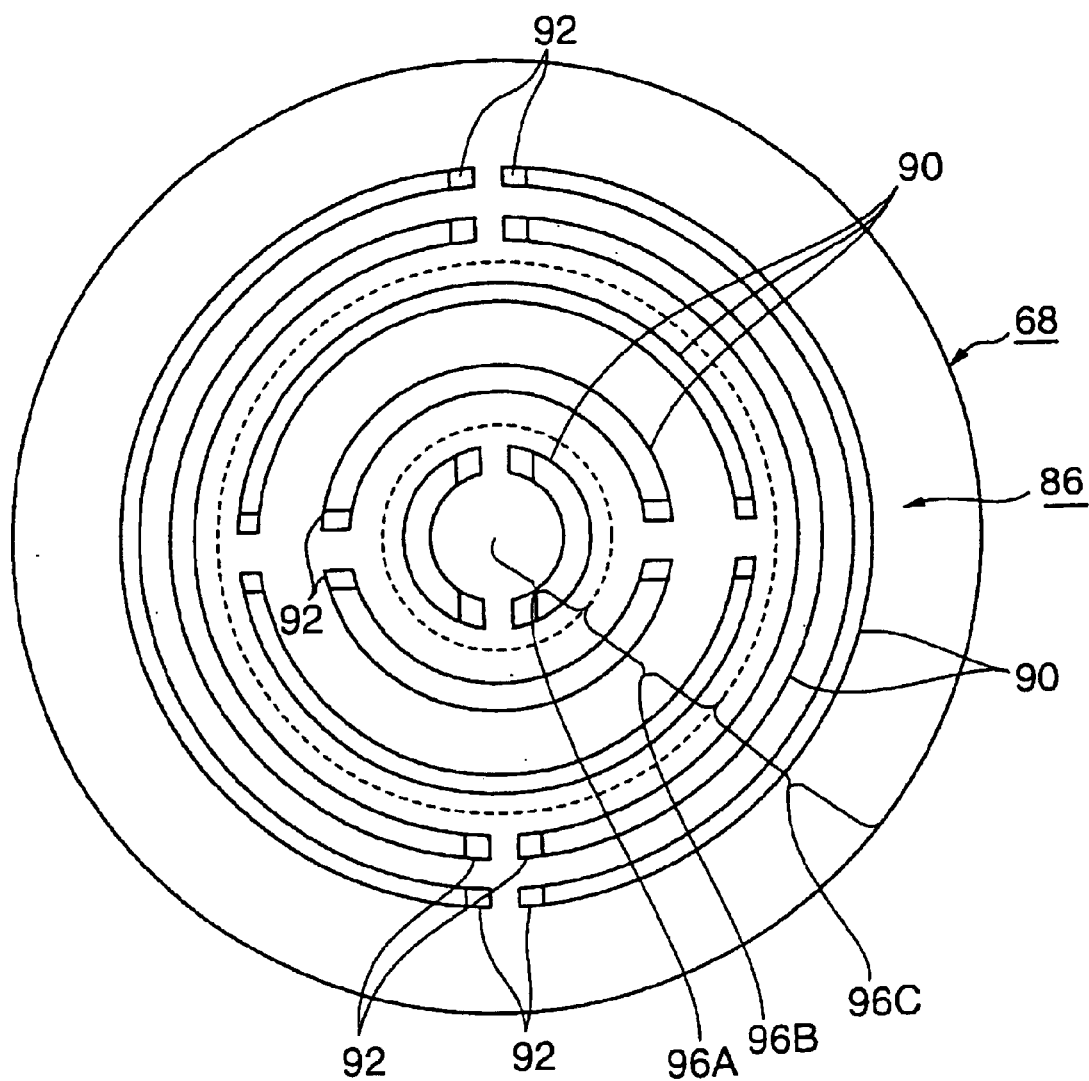
FIG. 12 shows a plan view of an arrangement of heating lamps of a heating lamp system of the thermal processing system shown in FIG. 9.

FIG. 9 shows a configuration of the thermal processing system in the embodiment of the present invention, and FIG. 10 shows a cross-sectional view of the same thermal processing system taken along a line A—A shown in FIG. 9. FIG. 11 shows a plan view of a supporting frame member, and FIG. 12 shows a plan view indicating an arrangement of tube-shaped heating lamps.

As shown in the figures, this thermal processing system 40 includes a processing chamber 42 formed to be like a cylinder from stainless steel, aluminum, or the like, for example. In a side wall of the processing chamber 42 near the top thereof, a processing gas nozzle 44 for supplying a necessary processing gas into the processing chamber 42 is provided, and, a discharge mouth 46 is provided in the side wall of the processing chamber 42 opposite to the above-mentioned nozzle 44. To the mouth 46, a vacuum pump or the like, not shown in the figure, is connected, so that the processing chamber 42 can be made vacuum thereby.

In the processing chamber 42, a support ring 48 is provided acting as a placement table shaped to be a circular ring, for example, so as to support a to-be-processed object, such as a semiconductor wafer W. This support ring 48 is connected to the top end of a leg part 50 formed to be like a cylinder. Then, the above-mentioned support ring 48 has a wafer holding part 51 formed as a result of the inner part of the top end of the ring 48 being cut out to have an L-shaped section circumferentially. The rear side of the periphery of the semiconductor wafer W regarded as the to-be-processed object is made contact with the wafer holding part 51. Thus, the wafer W is supported/held by the support ring 48.

As the temperature of the wafer W becomes such a high temperature as maximum 1000° C., for example, the support ring 48 is made of ceramics superior in heat resistivity, such as SiC, for example. Further, a heat insulating material such as a quarz glass is employed as a connecting part 53 between the support ring 48 and leg part 50 for the purpose of thermally protecting magnets or the like, described later, provided on the leg part 50.

Magnet parts 52 and coil parts 54 are provided on the side wall of the leg part 50 and the processing chamber 42 near the bottom thereof, respectively. Specifically, as also shown in FIG. 10, the magnet parts 52 include a pair of permanent magnets, for example, disposed apart from one another on the outer circumferential surface of the leg part 50 in directions of a diameter thereof.

The coil parts 54 include a plurality of coil units 56 disposed on an inner circumferential wall of the processing chamber 42 circumferentially with predetermined intervals (electric angles). These coil units 56 are set in positions such as to face the above-mentioned magnet parts 52 with a slight gap in a horizontal level. An alternate (electric) current is caused to flow through each coil unit 56, having a predetermined phase difference, for example, in sequence circumferentially. Thereby, a rotating magneitic field, the rotation speed of which can be controlled, can be formed near the bottom of the processing chamber 42. Then, the magnet parts 52 magnetically attracted by the rotating magnetic field is attracted so as to follow the rotation of the rotating magnetic field. Accordingly, the led part 50 is rotated thereby.

In this case, the bottom end of the leg part 50 is not connected to the bottom of the processing chamber 42, and can float therefrom. Specifically, as shown in FIG. 9, in a middle level of the leg part 50, a circular-ring-like floating magnet part 58 is mounted and fixed to the outer circumferential wall of the leg part 50, circumferentially so as to be like a flange. The floating magnet part 58 is a circular-ring-shaped permanent magnet made from a thin plate, for example, and extends horizontally.

It is assumed that the top side of the floating magnet part 58 has an N pole while the bottom side thereof has an S pole. A magnet holding recess part 60 is formed in the inner circumferential wall of the processing chamber 42, extending horizontally and circumferentially, so as to hold therein the above-mentioned flange-like floating magnet part 58, in a freely movable state.

The magnet holding recess part 60 is formed to be like a ring circumferentially along the inner circumferential wall of the processing chamber 42. Further, a plurality of magnet units 62 are provided in the magnet holding recess part 60 at predetermined positions such as to magnetically apply a floating force to the floating magnet part 58. Specifically, as shown in FIG. 10, the magnet units 62 include three units 62 along the circumferential inner wall of the processing chamber 42 with equal intervals. The respective magnet units 62 include upper coil units 62A, 62B and 62C and lower coil units 62a, 62b and 62c so as to sandwich the above-mentioned floating magnet part 58 vertically.

Electromagnetic forces, for example, repellent forces, generated by the respective coil units 62A, 62B, 62C, 62a, 62b and 62c are controllable by control of electric currents caused to flow therethrough individually. In this case, the electric currents are caused to flow through the respective coil units in directions such as to cause the electromagnetic repellent forces to be generated thereby so as to cause these coil units to repel the above-mentioned floating magnet part 58. As a result, the leg part 50, that is, the floating magnet part 58 floats. Although not shown in the figures, sensors are provided in the leg part 50 for detecting the horizontal and vertical positions of the leg part 50. Thereby, the electric currents flowing through the coil units are appropriately controlled.

Figure 1:
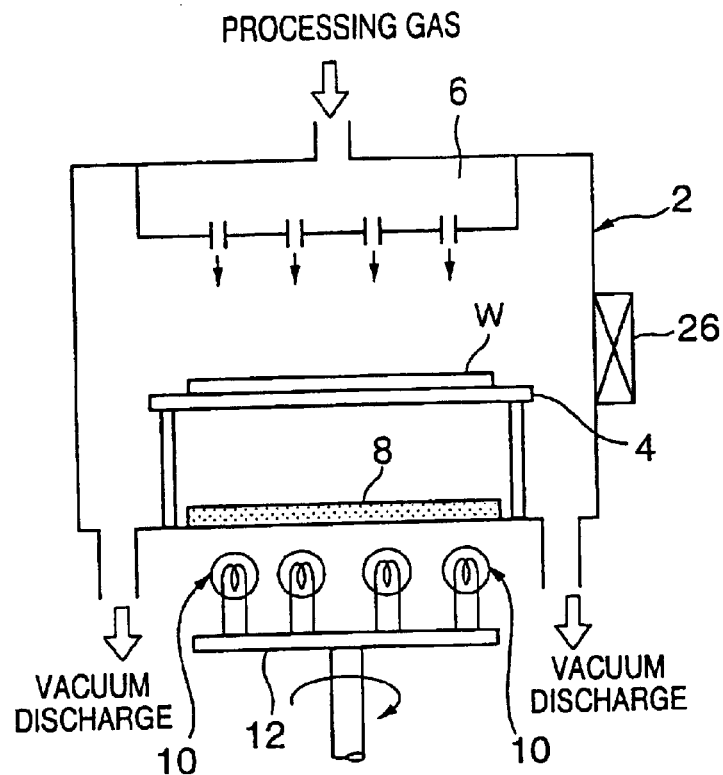
FIG. 1 shows a first example of a thermal processing system in the related art.
Figure 2:
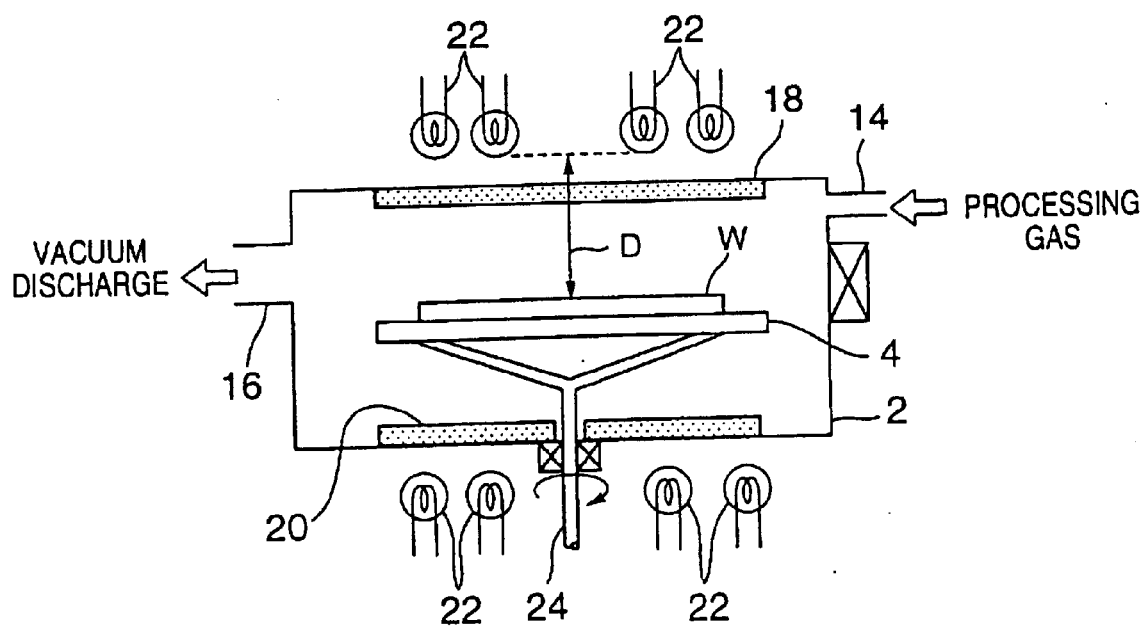
FIG. 2 shows a second example of a thermal processing system in the related art.
Figure 3A:
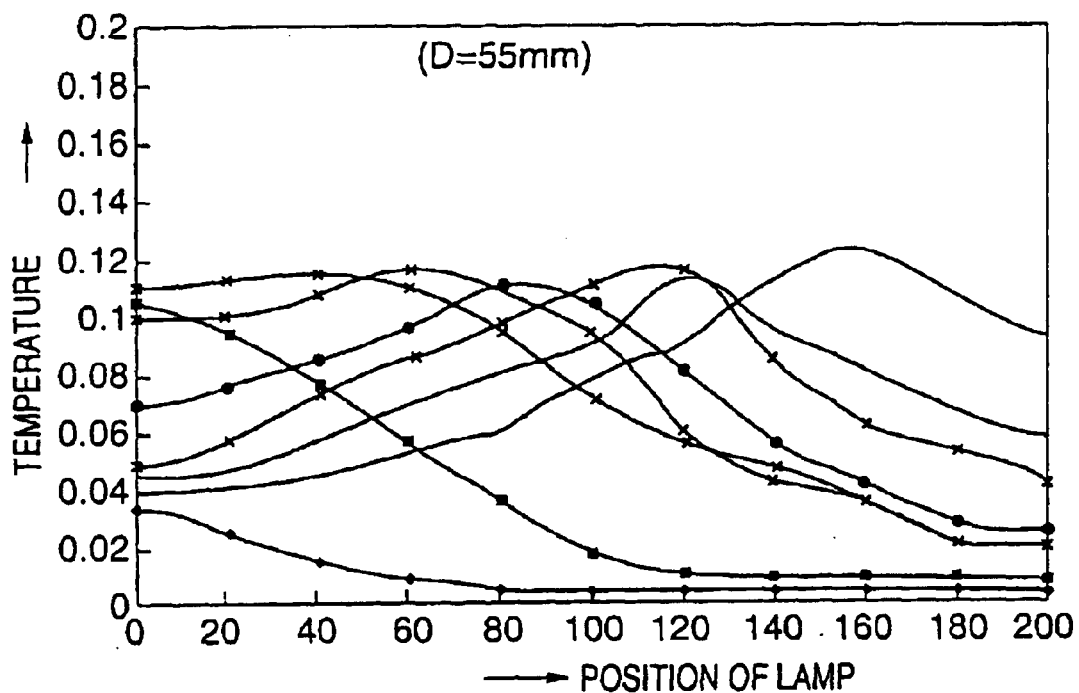
FIGS. 3A and 3B show graphs of relationship between the directivity of heating lamps and distance from the lamps.
Figure 3B:
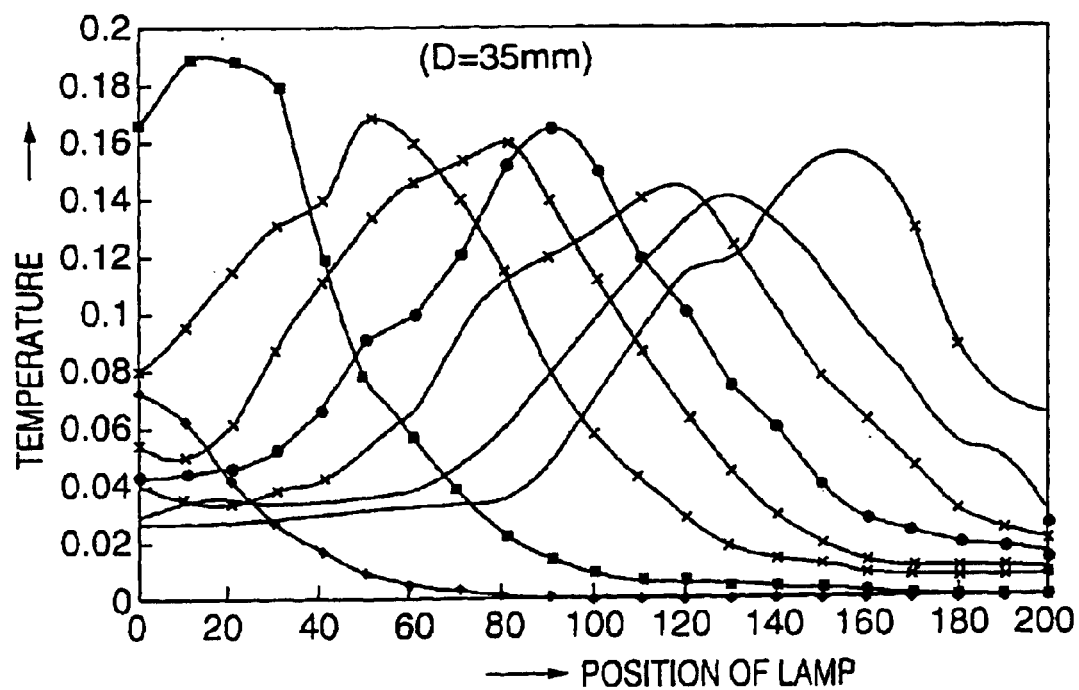
Figure 4:
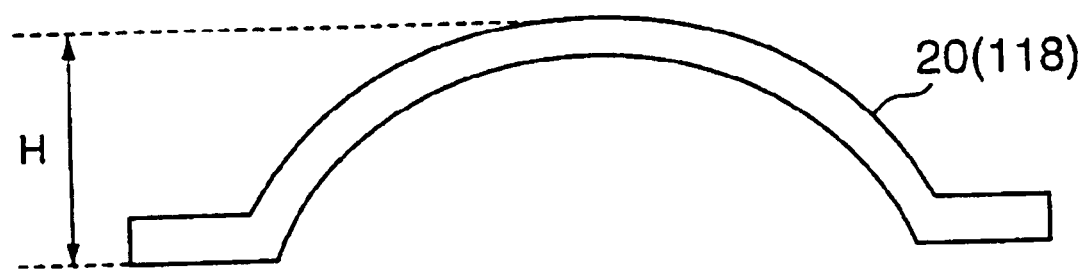
FIG. 4 shows a sectional view of a dome-shaped transmitting window in one example.

In the embodiment, the leg part 50 and support ring 48 are rotated in a non-contact state by means of magnetic floating. However, it is also possible that the leg part 50 is rotatably supported by a bearing on the bottom of the processing chamber 42, and, by magnets disposed outside of the processing chamber 42, the leg part is rotated, through magnetic coupling. Alternatively, it is also possible that the support ring is rotated by a rotation shaft, shown in FIG. 2.

The top of the processing chamber 42 is open, and, at this position, the above-mentioned supporting frame member 66 is provided via a sealing member 64 such as an O-ring, for example. Further, above the supporting frame member 66, a transparent transmitting window 68 made of quarz is mounted via a sealing member 70 such as an O-ring circumferentially in an airtight manner. Specifically, the top surface of the supporting frame member 66 is in contact with the bottom surface of the transmitting window 68, so that the pressure resistivity of the transmitting window 68 is improved. For example, the entirety of the supporting frame member 66 is made of a material, such as aluminum, stainless steel or the like, which does not cause any problem such as metal contamination or the like. This supporting frame member 66 has a circular-ring-shaped periphery, and, inside thereof, a plurality of supporting frames 72 are formed in parallel to each other with approximately equal intervals, as shown in FIG. 11. In the figure, the number of supporting frames is 5. However, actually, it is 10 odd, for example, corresponding to the diameter of the wafer W.

Further, although the plurality of supporting frames 72 are provided in parallel to each other in this example, the configuration of the supporting frames is not limited thereto. For example, it is also possible that a plurality of supporting frames are provided perpendicularly to each other so as to be like a lattice. By providing the supporting frame member 66 which supports the transmitting window 68 by a plane, it is possible to maintain high pressure resistivity of the transmitting window 68 even when the thickness t of the transmitting window 68 is made smaller. As the number of supporting frames 72 is increased, the pressure resistivity of the transmitting window is improved. However, in consideration of the amount of radiant heat generated by a heating lamp system 86 to be transmitted by the transmitting window 68, it is preferable to set the opening ratio (ratio of the area for which the radiant heat can pass through) to be equal to or larger than 60%. In this case, specifically, for example, the width L1 of each supporting frame 72 is on the order of 12 mm, while the interval L2 between each adjacent supporting frames 72 is on the order of 16 mm.

Further, as shown in FIG. 11, temperature controlling medium paths 74 are formed in the supporting frames 72 and the periphery of the supporting frame member 66 through drilling by means of a drill. One end of each of the paths 74 communicates with an inlet header 78 having a medium inlet 76, in common. Further, the other end thereof communicates with an outlet header 82 having an outlet 80, in common. Thereby, when heating is performed, a hot water or the like is caused to flow therethrough. When cooling is performed, a cold water or the like is caused to flow therethrough. Thus, the supporting frame member 66 and thus transmitting window 68 are heated or cooled so that temperature control therefor can be performed. In this case, specifically, for example, the diameter L3 of each medium path 74 is approximately 4 mm.

Above the transmitting window 68, a lamp box 84 is provided. In the lamp box 84, the above-mentioned heating lamp system 86 is provided, and heats the semiconductor wafer W inside the processing chamber 42 by means of the radiant heat therefrom. Specifically, as shown in FIG. 12, the heating lamp system 86 includes a plurality of tube-like heating lamps 90, each having electric terminals 92 at both ends, disposed concentrically so as to correspond to the semiconductor wafer W having an approximately circular shape. In the example shown in FIG. 12, a plural types of pairs of approximately semicircular tube-like double-end heating lamps 90 having different bending radii, having approximately semicircular shapes and having arc shapes, are disposed concentrically so as to correspond to the wafer W having an approximately circular shape. The electric terminals 92 of the respective heating lamps 90 are connected with electric power supply wires (not shown in the figure). Inside of each of the tube-like heating lamps 90, a filament 94 (see FIG. 9) is provided so as to be connected between the two terminals 92. Thus, each heating lamp 90 is a halogen lamp, for example.

The above-mentioned concentrically disposed tube-like heating lamps 90 are used for heating a plurality concentric zones, that is, an inner zone 96A, a middle zone 96B and an outer zone 96C, of the surface of the wafer W, as shown in FIG. 12, for example. In the example of FIG. 12, the heating lamps 90 are disposed so that a single circle of lamps 90 are provided for the inner zone 96A, double circles thereof are provided for the middle zone 96B and double circles thereof are provided for the outer zone 96C. However, actually, further larger number of different-diameter circles of lamps are provided therefor.

Then, above each of the respective tube-like heating lamps 90, a reflective plate 98 having an approximately semicircular section or trapezoidal section, as shown in FIG. 9, is mounted. Thereby, also the light reflected thereby is made to be applied to the wafer W. In FIG. 12, indication of the reflective plates 98 is omitted.

The above-mentioned tube-like heating lamps 90 are connected with a lamp control part 200 for each zone. Further, on the bottom of the processing chamber 42, a plurality of radiation thermometers 202 corresponding to the respective zones are provided, as shown in FIG. 9, and, the temperatures of the heating lamps 90 are controlled for the respective zones according to a feedback manner based on the wafer temperatures obtained through the respective radiation thermometers 202, respectively, individually. Thus, the temperature of the wafer W is maintained to be a predetermined uniform temperature throughout the entire surface of the wafer W especially along the radial directions.

Further, as shown in FIG. 9, medium paths 204 are formed in the side wall and bottom plate of the processing chamber 42 approximately through the entire periphery of the processing chamber 42 for passing a temperature controlling medium therethrough. From a medium inlet 204A provided at a part of the side wall, the temperature controlling medium is provided into the medium paths 204, and, from a medium outlet 204B provided at another part of the side wall, the temperature controlling medium is discharged. This temperature controlling medium may be the same as the temperature controlling medium which is used to flow through the medium paths 74 provided in the supporting frame member 66. According to a request concerning a process to be performed on the wafer W, the temperature controlling medium is used for cooling, or heating the processing chamber 42 so as to control the temperature thereof. It is possible to provide an independent systems such that thereby the temperature controlling medium to flow through the medium paths 74 of the supporting frame member 66 and the temperature controlling medium to flow through the medium paths of the processing chamber 42 can be controlled in temperature thereof individually. Instead, it is also possible to provide a system such that the temperature controlling medium is to flow through the medium paths 74 and 104 continuously.

In FIG. 9, a gate valve 206 is opened/closed when the semiconductor wafer W is conveyed into and out from the processing chamber 42. Further, although not shown in the figure, a lifter pin for lifting/lowering the wafer W is also provided at a bottom part of the processing chamber 42 which works during the conveyance of the wafer W.

Operation of the thermal processing system in the embodiment of the present invention described above will now be described.

First, the semiconductor wafer W is brought in into the processing chamber 42 which is maintained in a vacuum condition, from a load lock room or the like, not shown in the figures, via the opened gate valve 206. This wafer W is placed on the wafer holding part 51 of the support ring 48 by means of the above-mentioned lifter pin, and is held thereby.

Then, after thus bringing in of the wafer W is completed, the gate valve 206 is closed so that the processing chamber 42 is sealed, and, also, a predetermined processing gas corresponding to a process to be performed on the wafer W is provided into the processing chamber 42 via the processing gas nozzle 44 while the pressure in the processing chamber 42 is being reduced to produce a vacuum therein. Then, the predetermined process pressure is maintained in the processing chamber 42. For example, in a case where a deposition process is performed on the wafer W as the thermal processing, a deposition gas is provided into a processing space S in the processing chamber 42 together with a carrier gas such as $N_2$ gas.

Then, the heating lamp system 86 provided at the top of the processing chamber 42 is driven so that the heating lamps 90 are turned on. Then, heat rays emitted by the heating lamp system 86 are incident into the processing space S through the transparent transmitting window 68. Then, the heat rays are applied onto the top surface of the semiconductor wafer W, and, thereby, the surface of the wafer W is heated into a predetermined temperature. Then, it is maintained in this temperature.

Simultaneously, the respective coil units 56 of the above-mentioned coil parts 54 provided at the lower part of the inside of the processing chamber 42 have the alternate (electric) currents having predetermined phase differences flowing therethrough in sequence. Thereby, the rotating magnetic field having the predetermined rotation speed is formed inside the processing chamber 42 (see FIG. 10). Then, the magnet parts 52 of the leg part 50 move so as to follow the rotating magnetic field. Accordingly, the leg part 50 and support ring 48 rotate thereby. As a result, the semiconductor wafer W held by the support ring 48 is rotated during the thermal processing interval. Thereby, a condition in that the temperature of the wafer W is made uniform throughout the surface of the wafer W is maintained.

Further, at this time, the upper and lower coil units 62A, 62B, 62C, 62a, 62b and 62c of the three respective floating magnet parts 62 provided in the magnet holding recess part 60 of the processing chamber 42 have electric currents flowing therethrough so that the repellent forces are generated between these coil units and the flange-shaped floating magnet part 58 located between the coil units. By the repellent forces, the flange-shaped floating magnet part 58 and the leg part 50 integral therewith float. Accordingly, the leg part 50 is rotated in a condition in which it floats magnetically. As a result, the leg part 50 is rotated stably in the magnetically floating condition. Thus, the leg part 50 is supported without using any bearing or the like, in a non-contact condition. As a result, problems such as generation of particles due to friction, metal contamination and so forth can be avoided.

Figure 5:
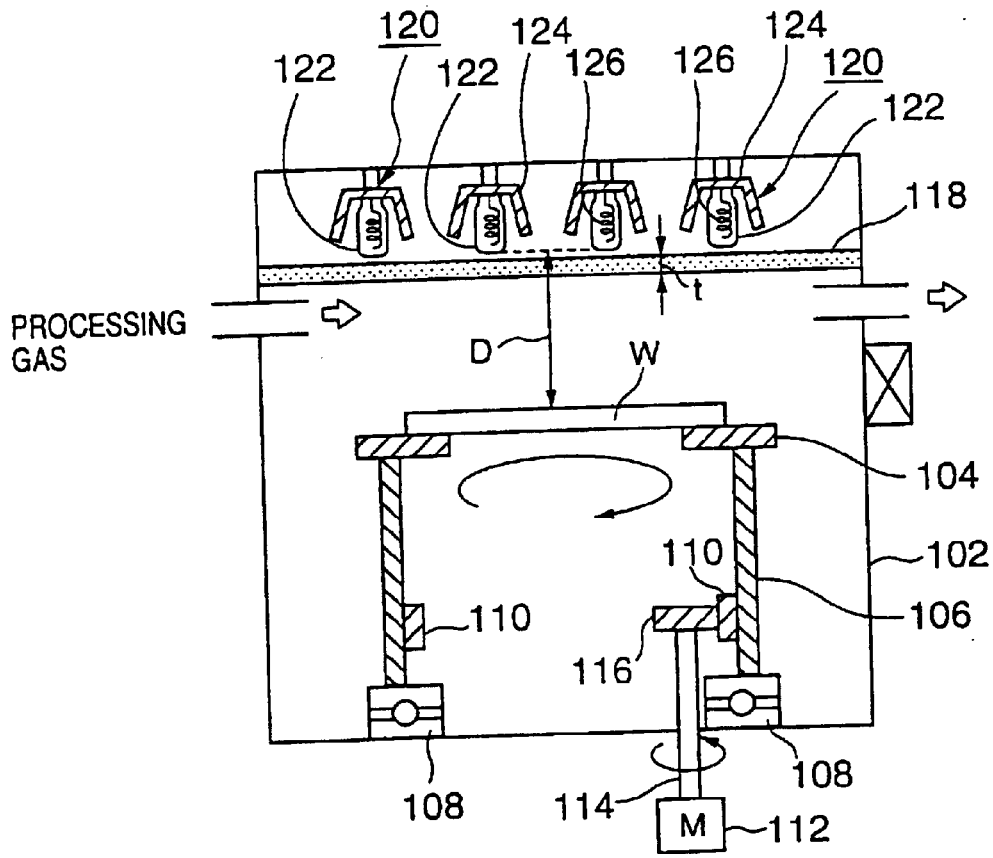
FIG. 5 shows a third example of a thermal processing system in the related art.

Further, the transmitting window 68 is reinforced as a result of the bottom surface of the transmitting window 68 being firmly supported by the supporting frame member 66 having the plurality of supporting frames 72 in a surface contact condition so that the pressure resistively of the transmitting window 68 is considerably improved. Accordingly, it is possible to reduce the thickness of the transmitting window 68. For example, in the system in the related art shown in FIG. 5, the thickness of the transmitting window should be 30 through 40 mm for the diameter of 400 mm. However, in the embodiment of the present invention described above, merely the thickness on the order of 2 through 5 mm is sufficient. Accordingly, it is possible to reduce the thickness t of the transmitting window 68 remarkably. By reducing the thickness t of the transmitting window 68, it is possible to reduce the distance D between the surface of the wafer W and the heating lamp system 86. Thereby, it is possible to improve the directivity of the radiant heat from the heating lamp system 86.

Furthermore, the medium paths 74 are provided in the supporting frames 72 of the supporting frame member 66 as shown in FIG. 11. By causing the temperature controlling medium such as coolant, that is, cooling water, for example, to flow therethrough, when cooling is performed, for example, it is possible to cool the supporting frame member 66 and thus the transmitting window 68 thereabove to a temperature on the order of the room temperature of the processing chamber 42. Accordingly, occurrence of metal contamination due to melting of the supporting frame member 66, adherence of reaction by-product or the like to the bottom surface of the transmitting window 68 or the surface of the supporting frame member 66, and so forth, especially in a case of deposition profess, can be avoided. Further, by controlling the cooling temperature to a fixed temperature by controlling the temperature and/or flow rate of the coolant, thermal influence given to the wafer W by the supporting frame member 66 and transmitting window 68 can be made to be always constant. Accordingly, it is possible to eliminate variations in degree of thermal processing performed on the respective wafers W, one by one, which may be easily affected by the temperature sensitively. Thereby, it is possible to remarkably improve repeatability. In a case where the transmitting window 68 should be heated due to a request according to a process, a heat medium is caused to flow through the paths 74.

Similarly, the temperature controlling medium, for example, a coolant such as a cooling water, when cooling is performed, is caused to flow through the medium paths 204 provided in the side wall and bottom plate of the processing chamber 42 described above. Thereby, the side wall and bottom plate of the processing chamber 42 is cooled so that almost all the surfaces of the side wall and bottom plate of the processing chamber 42 enter a completely cold wall condition. Thereby, it is possible to avoid adherence of reaction by-product or a deposition film, produced in a case of a deposition process or the like, to the inner wall of the processing chamber 42. Also in this case, by controlling the temperature and/or flow rate of the coolant so that the cooling temperature is constant. it is possible to improve the repeatability of the thermal processing performed on the wafer W, by the reason same as that mentioned above.

Thus, the top, that is, the transmitting window 68, side wall, bottom wall and so forth of the processing chamber 42 are prevented from being adhered to by a reaction by-product, a deposition film or the like. Accordingly, it is possible to reduce the amount of particles produced, and it is possible to reduce the frequency of times of cleaning operations performed on the processing chamber 42 and so forth.

Specific controlling temperatures of the transmitting window 68, side wall and bottom plate of the processing chamber 42 in a case where deposition processing is performed as thermal processing will now be described. In order to avoid adherence of reaction by-product or a deposition film, the temperature is maintained at on the order of 150 through 500° C., for example, in order to avoid adherence of $NH_4Cl$ or the like which is reaction by-product in a case of deposition of silicon nitride film by using $SiH_2Cl_2$ and $NH_3$. The temperature is maintained at on the order of 0 through 400° C., for example, in a case of deposition of polysilicon film by using $SiH_4$, or $Si_2H_6$. The temperature is maintained at less than 150° C., for example, in order to avoid adherence of a raw material gas or a liquefied by-product in a case of deposition of $Ta_2O_5$ film using $Ta_2(OC_2H_5)_5$ (penthaethoxytantal) or the like. The temperature is maintained at on the order of 100 through 200° C., for example, in order to avoid adherence of TEOS itself in a case of deposition of $SiO_2$ film by using TEOS.

Figure 6:
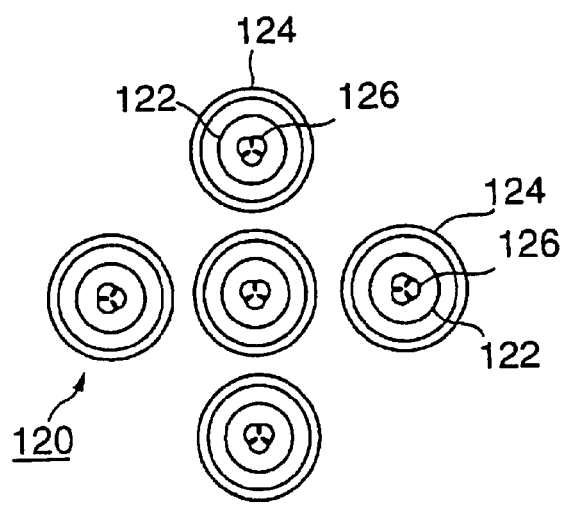
FIG. 6 shows an arrangement of heating lamps of the system shown in FIG. 5.
Figure 7:
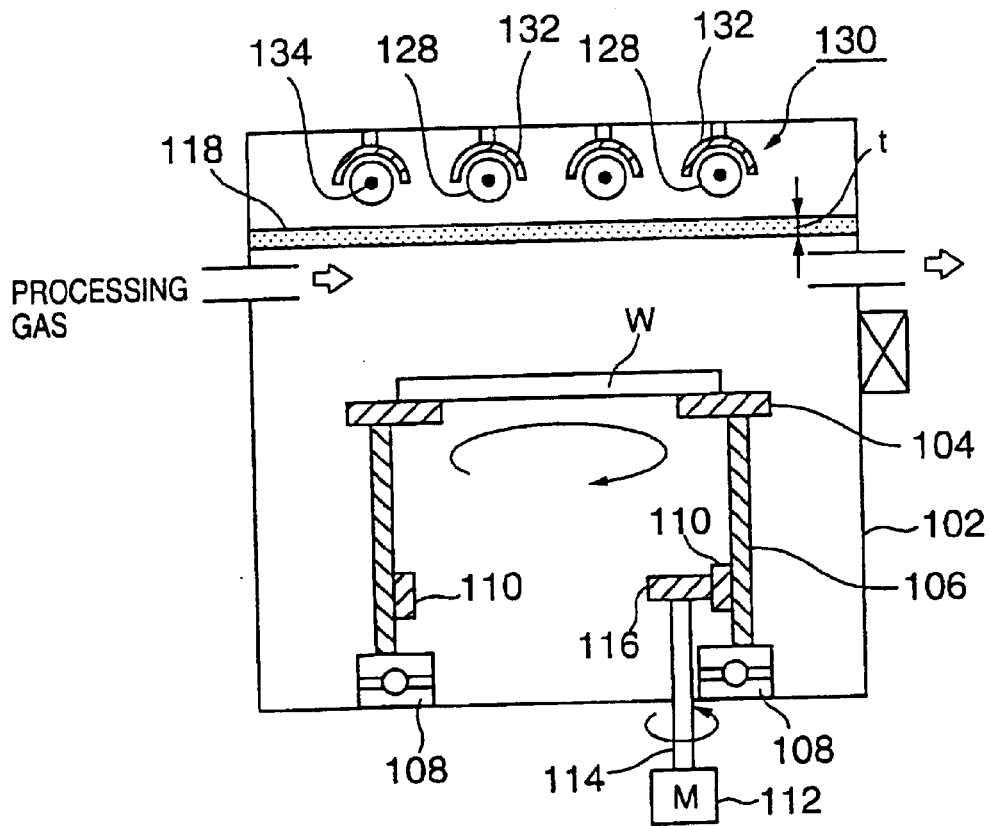
FIG. 7 shows a fourth example of a thermal processing system in the related art.
Figure 8:
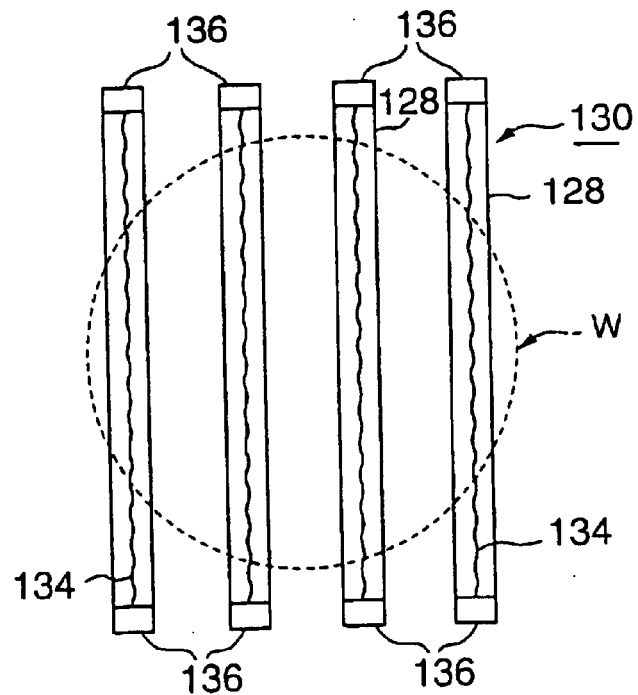
FIG. 8 shows an arrangement of heating lamps of the system shown in FIG. 7.

In the above-described embodiment, the heating lamp system 86 includes the concentrically disposed tube-like heating lamps 90 formed to have approximately semicircular shapes, and, also, the powers supplied to the lamps 90 are controlled for the respective zones, respectively, independently through control by the control part 200. Accordingly, first, in comparison to the case of employing the single-end lamps shown in FIGS. 5 and 6, a large amount of radiant heat emitted from the lamps 90 is not reflected but directly applied to the wafer W. Accordingly, it is possible to efficiently heat the wafer W.

Further, as mentioned above, the periphery of the wafer W may have a relatively large amount of heat discharged therefrom in comparison to the center thereof. In order to deal with such a situation, in the above-described embodiment, as a result of the lamps 90 being disposed concentrically as mentioned above and the supply powers being controlled for the respective concentric zones, respectively, individually, it is possible to improve the directivity thereof, and, also, to perform temperature control at high accuracy along the radial directions of the wafer W. Thus, it is possible to control the temperature of the surface of the wafer W to be uniform throughout the surface of the wafer W effectively. The above-mentioned directivity can be improved also by reducing the thickness t of the transmitting window 68 as mentioned above. Accordingly, the directivity can be further improved.

In the example of FIG. 12, each heating lamp 90 is formed to be like a semicircle. However, the opening angle of the arc shape thereof is not limited thereto, and, it is possible to form each heating lamp 90 into an arc shape having the opening angle of 90° (¼ arc), an arc shape having the opening angle of 60° (⅙ arc), or the like. Further, it is also possible that tube-like heating lamps having arc shapes having different opening angles for different zones are combined.

Figure 13:
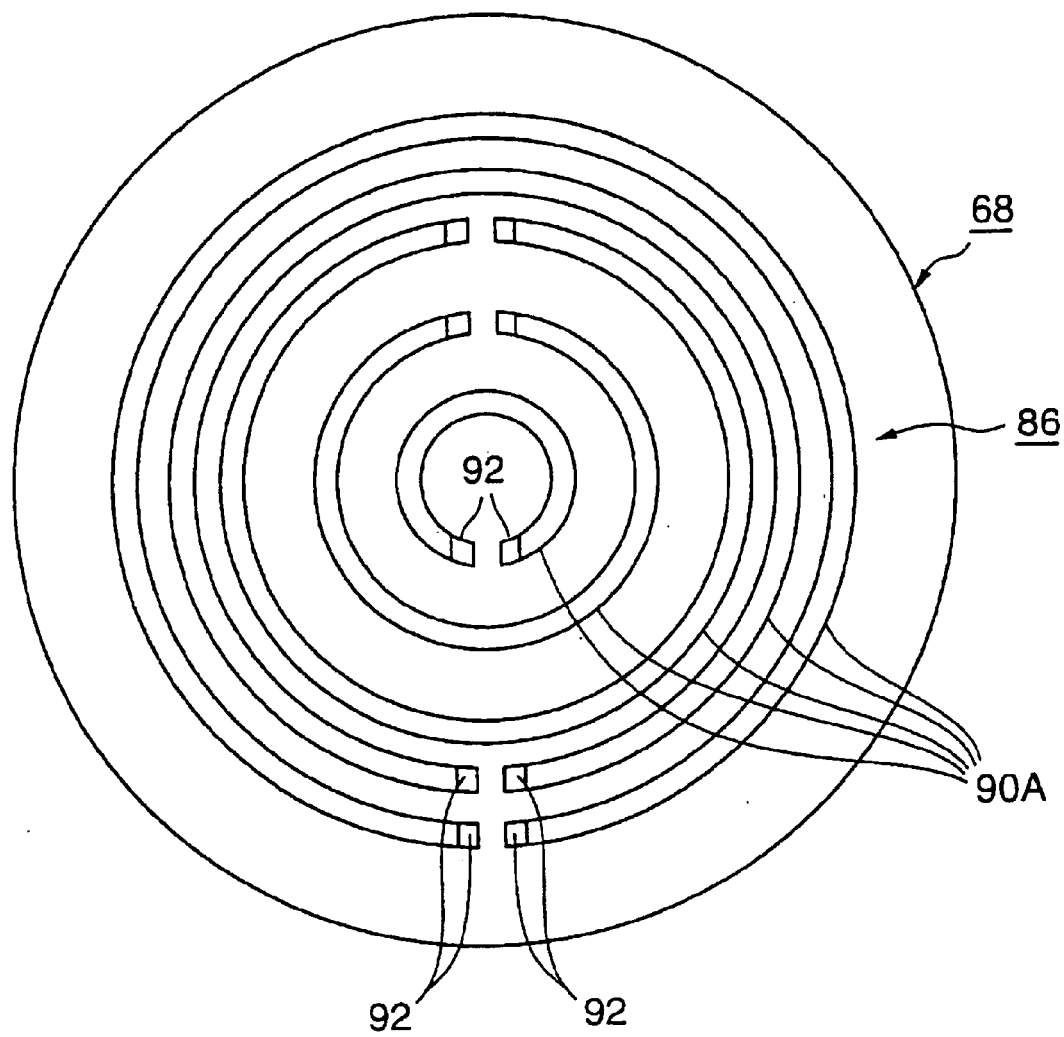
FIG. 13 shows a plan view of another arrangement of heating lamps of a heating lamp system which also can be instead employed in the thermal processing system shown in FIG. 9.

Further, it is also possible to employ approximately circular ring-shaped tube-like heating lamps 90A in each of which only a part of a circle is cut out, as shown in FIG. 13.

Figure 14:
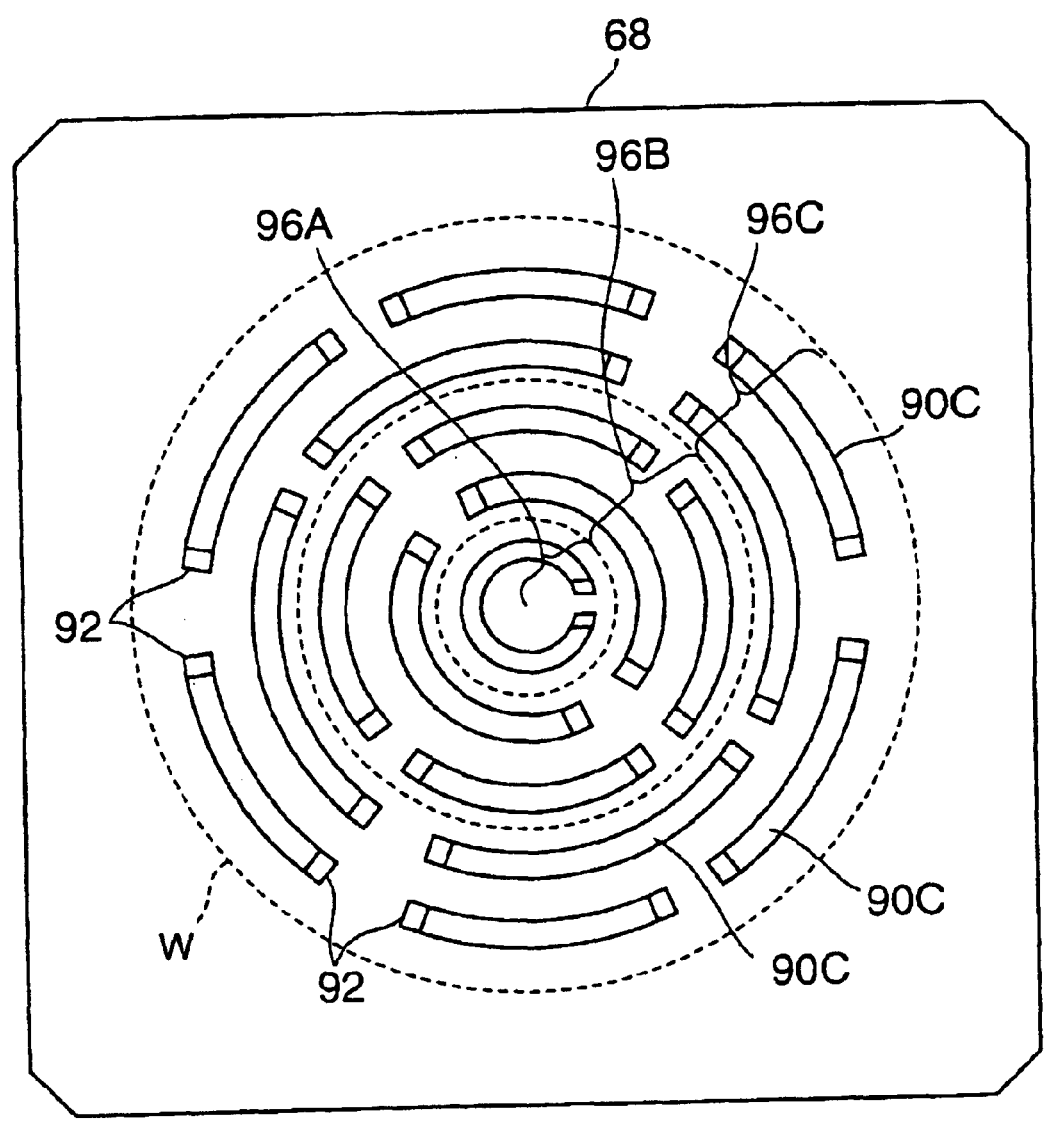
FIG. 14 shows a plan view of another arrangement of heating lamps of a heating lamp system which also can be instead employed in the thermal processing system shown in FIG. 9.
Figure 15:
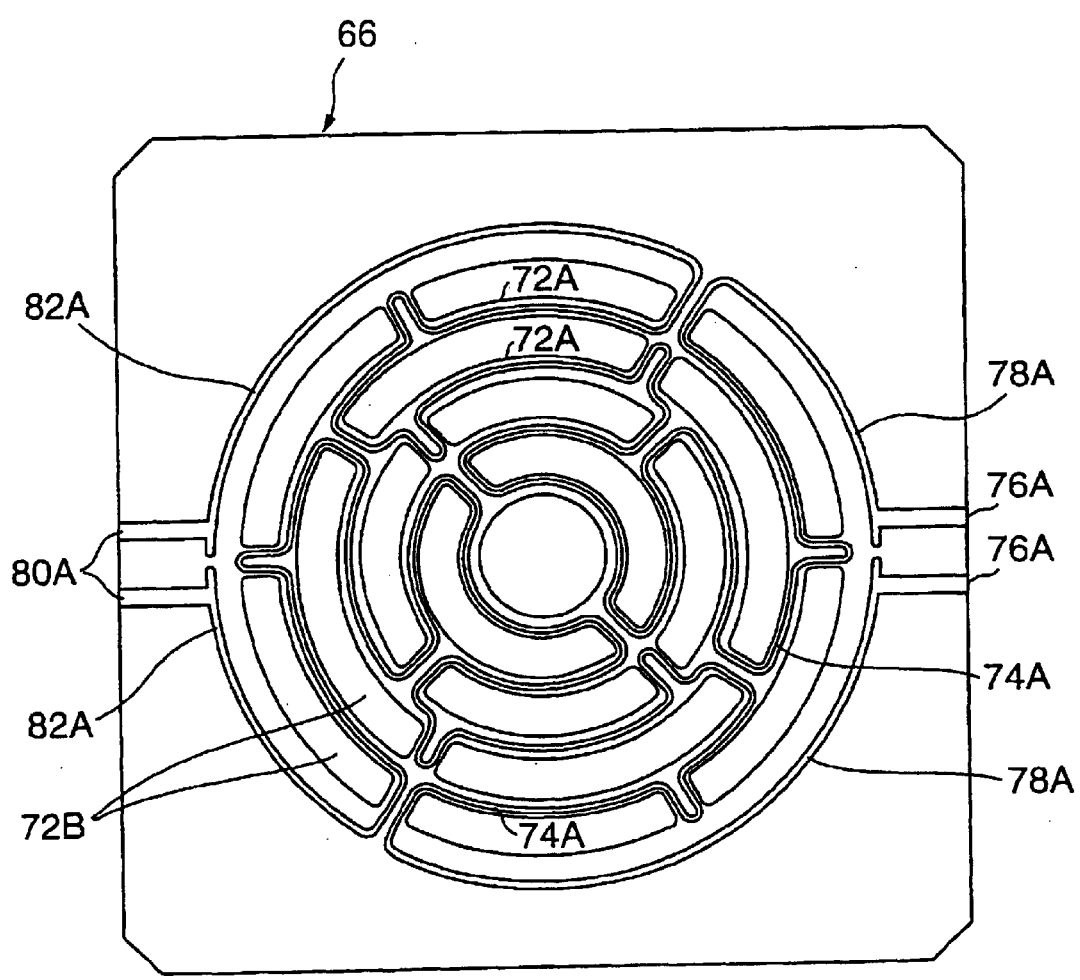
FIG. 15 shows a plan view of another supporting frame member which also can be instead employed together with the heating lamp system shown in FIG. 14 in the thermal processing system shown in FIG. 9.

Further, as shown in FIGS. 14 and 15, in the supporting frame member 66, supporting frames 72A including temperature controlling medium paths 74A may be shaped so as to prevent these supporting frames 72A from blocking the radiant heat emitted from concentrically disposed arc-shaped tube-like heating lamps 90C shown in FIG. 14. In this example, as shown in FIG. 15, slits 72B are formed in locations such as to correspond to the locations of the respective arc-shaped tube-like heating lamps 90C shown in FIG. 14, respectively. Accordingly, the radiant heat emitted by the lamps 90C can effectively reach the wafer W through the transmitting window 68 and thus be efficiently utilized for heating the wafer W. Further, in the configuration shown in FIGS. 14 and 15, as each lamp 90C faces the wafer W without being blocked by the supporting frames 72A through the respective slit 72B, it is possible for each lamp 90C to directly heat a respective zone of the wafer W. Accordingly, it is possible to control the temperature of the wafer W at a higher accuracy. Thus, the temperature controllability of the wafer W is improved.

Figure 16:
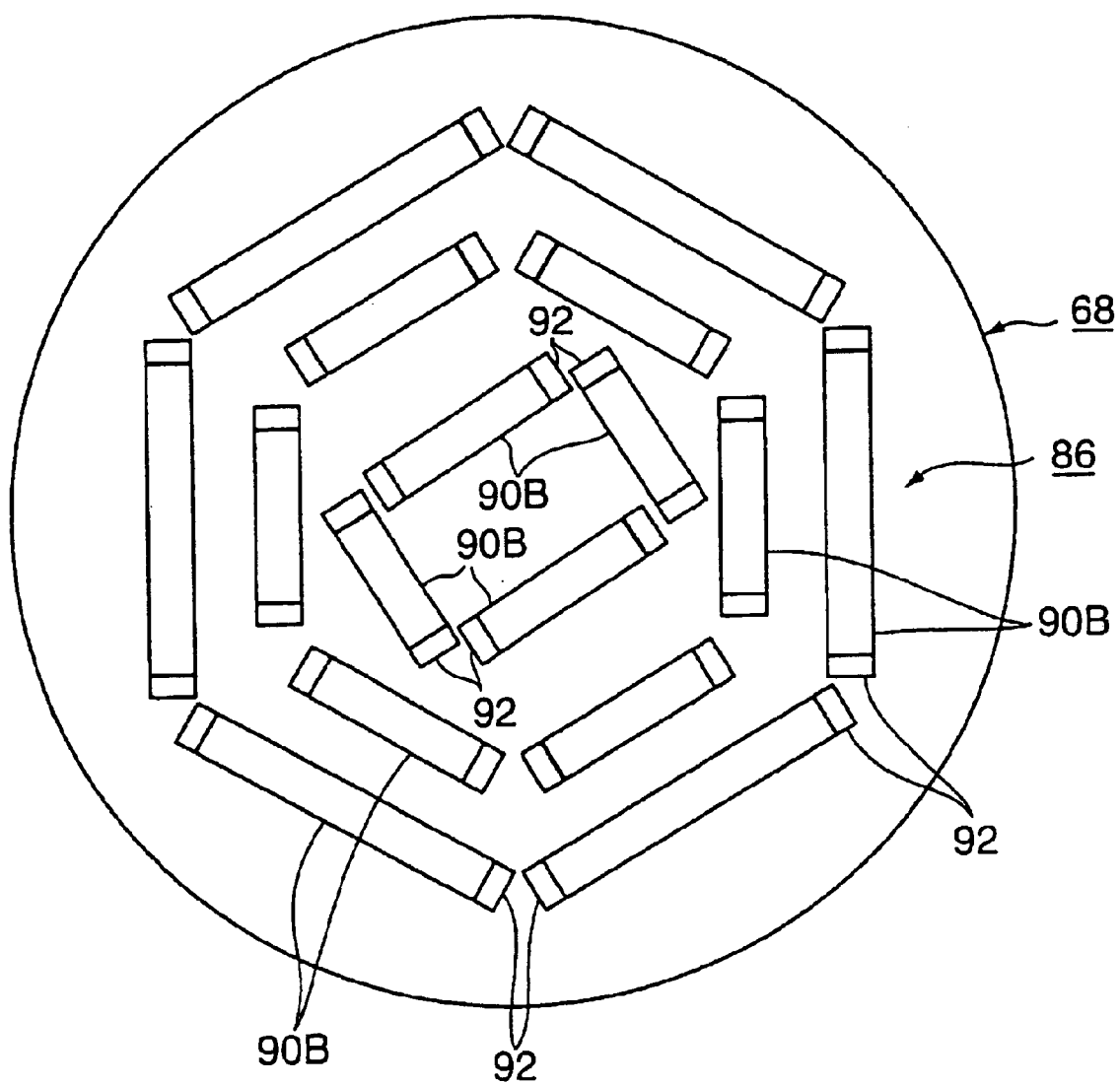
FIG. 16 shows a plan view of another arrangement of heating lamps of a heating lamp system which also can be instead employed in the thermal processing system shown in FIG. 9.

Further, as shown in FIG. 16, it is also possible to employ a plurality of straight-rod-shaped tube-like heating lamps 90B, which may be general-purpose ones and thus inexpensive, disposed approximately concentrically for the respective zones. In this case, the length of each straight-rod-shaped heating lamp 90B should be different so as to correspond to the curvature of the respective zone.

Further, it is also possible to appropriately combine these straight tube-like heating lamps 90B with the above-mentioned arc-shaped tube-like heating lamps 90, 90A.

Figure 17:
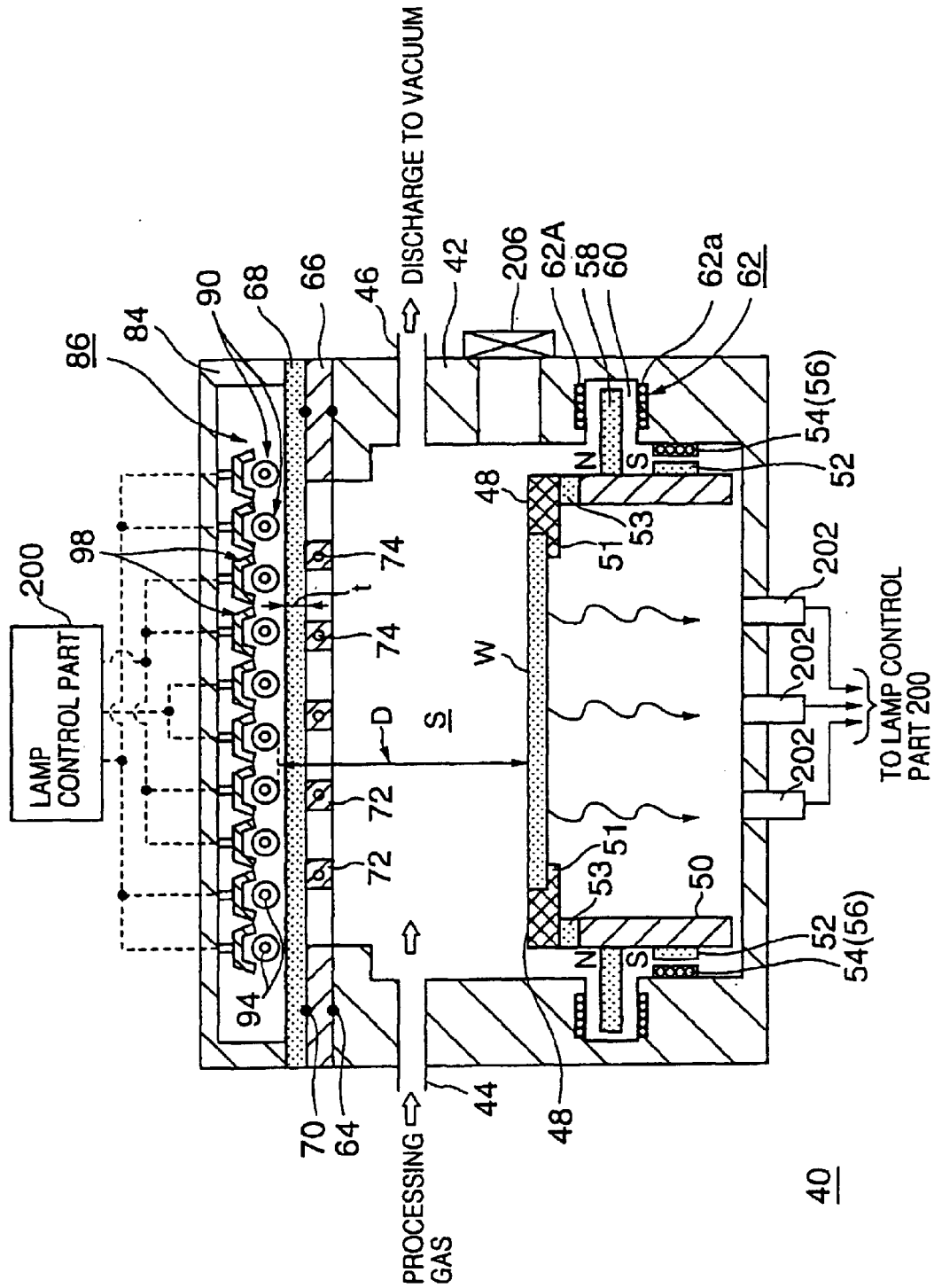
FIG. 17 shows a side-elevational sectional view of a thermal processing system in a variant embodiment of the embodiment of the present invention shown in FIG. 9 in which medium paths for temperature control are omitted from a side wall and a bottom plate of a processing chamber.

Further, it is also possible to omit the provision of the medium paths 204 from the side wall and bottom plate of the processing chamber 42, as shown in FIG. 17 in a situation in which adherence of deposition film or reaction by-product is not so serious and/or not so problematic according to a process.

Further, in the above-described embodiment, processing is performed under a reduced pressure atmosphere or a vacuum atmosphere such as in a CVD process. However, in a case where thermal processing is performed under an atmospheric pressure atmosphere or an atmosphere near the atmospheric pressure atmosphere, such as in an annealing process, diffusion process and so forth, it is not necessary to provide the supporting frame member 66 to increase the pressure resistivity of the transmitting window, shown in FIG. 9. In this case, as shown in FIG. 18, the transmitting window 68 is set directly at the top of the processing chamber 42 only via the O-ring 64. Thereby, it is possible to further reduce the distance D between the surface of the wafer W and the heating lamp system 86. Accordingly, the directivity of the heating lamp system 86 is further improved, and thus, it is possible to further improve the accuracy of temperature control for the respective zones.

Further, in the above-described embodiment, the supporting frame member 66, transmitting window 68 and heating lamp system 86 are set at the top part of the processing chamber 42. However, it is also possible to set them at a bottom part of the processing chamber 42, or to set them at the top part and bottom part, respectively.

Further, although the to-be-processed object is a semiconductor wafer W in the embodiment, it is also possible to apply the present invention for a glass substrate, a LCD substrate, or the like.

Further, any thermal processing system according to the present invention can also be applied for a deposition process such as a CVD process, an oxidation process, and so forth, other than the above-mentioned annealing process.

It is also possible to rotate the heating lamp system with respect to the placement part of the wafer W in each embodiment of the present invention. Thereby, it is possible to heat the wafer W further uniformly.

Further, the present invention is not limited to the above-described embodiments, and variations and modifications may be made without departing from the scope of the present invention.

The present application is based on Japanese priority applications Nos. 2000-119997 and 2000-119998, both filed on Apr. 20, 2000, the entire contents of which are hereby incorporated by reference.

What is claimed is:

1. A thermal processing system for performing predetermined thermal processing on an approximately circular to-be-processed object, by applying radiant heat to the to-be-processed object by means of a heating lamp system, the thermal processing system comprising:
    said heating lamp system which comprises a plurality of lamps disposed concentrically so as to correspond to the to-be-processed object,
    said plurality of lamps being controlled individually for respective zones of the to-be-processed object;
    a wall of a chamber in which the to-be-processed object is processed which is cooled by providing a cooling medium to said wall through medium paths provided in said wall;
    a plane-shaped or dome-shaped transmitting window provided so as to seal said heating lamp system in an airtight manner;
    a transmitting window provided between said heating lamp system and the to-be-processed object; and
    a reinforcing member reinforcing said transmitting window,
    wherein said reinforcing member comprises a plurality of members disposed in parallel and each extending in parallel to a bottom side of said transmitting window.

2. The thermal processing system as claimed in claim 1, wherein said zones have concentric circular shapes, respectively.

3. The thermal processing system as claimed in claim 1, wherein said plurality of lamps comprise arc-shaped lamps.

4. The thermal processing system as claimed in claim 1, wherein said plurality of lamps comprise rod-shaped lamps.

5. The thermal processing system as claimed in claim 1, wherein said plurality of lamps are disposed so as to form a plurality of concentric circles having different radii.

6. A thermal processing system for performing predetermined thermal processing on an approximately circular to-be-processed object, by applying radiant heat to the to-be-processed object by means of a heating lamp system, the thermal processing system comprising:
    said heating lamp system which comprises a plurality of lamps disposed concentrically so as to correspond to the to-be-processed object, said plurality of lamps being controlled individually for respective zones of the to-be-processed object;

a wall of a chamber in which the to-be-processed object is processed which is cooled by providing a cooling medium to said wall through medium paths provided in said wall;

a plane-shaped or dome-shaped transmitting window provided so as to seal said heating lamp system in an airtight manner;

a transmitting window provided between said heating lamp system and the to-be-processed object; and a reinforcing member reinforcing said transmitting window, wherein said reinforcing member is configured so that concentric slits are formed therein corresponding to the concentrically disposed plurality of lamps.

7. The thermal processing system as claimed in claim 6, wherein each slit has an arc shape.

8. The thermal processing system as claimed in claim 1, further comprising a sealed processing chamber in which the to-be-processed object is sealed and processed under a reduced pressure atmosphere, wherein:

said transmitting window is provided as a part of said processing chamber in an airtight manner; and said heating lamp system is provided outside of said processing chamber and applies the radiant heat to the to-be-processed object inside of the processing chamber through said transmitting window.

9. The thermal processing system as claimed in claim 6, further comprising a sealed processing chamber in which the to-be-processed object is sealed and processed under a reduced pressure atmosphere, wherein:

said transmitting window is provided as a part of said processing chamber in an airtight manner; and said heating lamp system is provided outside of said processing chamber and applies the radiant heat to the to-be-processed object inside of the processing chamber through said transmitting window.

10. The thermal processing system as claimed in claim 8, wherein said wall having medium paths is provided as a part of said processing chamber in an airtight manner.

11. The thermal processing system as claimed in claim 9, wherein said wall having medium paths is provided as a part of said processing chamber in an airtight manner.

* * * * *